United States Patent [19]
Murata

[11] Patent Number: 5,333,733
[45] Date of Patent: Aug. 2, 1994

[54] LINKED CONTAINER FOR TRANSPORTING PRECISION DEVICES

[75] Inventor: Kentaro Murata, Yao, Japan

[73] Assignee: Gold Industries Co., Ltd., Osaka, Japan

[21] Appl. No.: 57,965

[22] Filed: May 7, 1993

[30] Foreign Application Priority Data

| May 13, 1992 | [JP] | Japan | 4-148231 |
| Dec. 25, 1992 | [JP] | Japan | 4-358444 |
| Dec. 25, 1992 | [JP] | Japan | 4-358445 |
| Dec. 25, 1992 | [JP] | Japan | 4-358446 |
| Dec. 25, 1992 | [JP] | Japan | 4-358447 |

[51] Int. Cl.⁵ .............................................. B65D 73/02
[52] U.S. Cl. ..................................... 206/330; 206/332; 206/820; 220/23.4
[58] Field of Search .................. 220/23.4, 23.83, 23.86; 206/328-330, 332, 820, 486, 526

[56] References Cited

U.S. PATENT DOCUMENTS

| 3,021,001 | 2/1962 | Donofrio | 206/820 X |
| 3,184,054 | 5/1965 | Kuhlman | 220/23.4 X |
| 3,605,374 | 9/1971 | Mueller et al. | 206/526 X |
| 3,701,079 | 10/1972 | Bowden et al. | 220/23.4 X |
| 3,719,272 | 3/1973 | Bodine et al. | 206/328 |
| 4,133,445 | 1/1979 | Mandelbaum | 220/23.4 |
| 4,225,042 | 9/1980 | Anthone et al. | 206/332 |
| 4,770,296 | 9/1988 | Wagatsuma | 206/330 |

FOREIGN PATENT DOCUMENTS 0240662  10/1991  Japan .................................. 206/330

Primary Examiner—Bryon P. Gehman
Attorney, Agent, or Firm—Edwin E. Greigg; Ronald E. Greigg

[57] ABSTRACT

A linked flexible band-like container for transporting precision devices has a series of recesses for receiving the devices, and a row of small portions at regular intervals along its lateral side(s) and engageable with driving lugs of a stepping driver. The container is composed of a row of repeating plastics units of the same dimension in the longitudinal direction, each unit defines at least one recess and has transverse sides "A" and "B". Each of junctions between these sides is a hinge which allows the adjacent sides to rotate relative to and in parallel with each other, due to a distance from the junction to the closest aperture on one unit is the same as that to the closest aperture on the next unit. The container having the rigid units can be bent without causing any curvature to remain after it is stretched.

2 Claims, 9 Drawing Sheets

LINKED CONTAINER FOR TRANSPORTING PRECISION DEVICES

BACKGROUND OF THE INVENTION

1. Field of the Invention

The present invention relates to a linked container for transporting precision devices such as IC chips, various electronic devices (for example, connectors, switches, transmitters and the like) and the comparatively small precision parts incorporated in precision machines (herein inclusively referred to as "IC chips"), wherein the IC chips take their individual and discrete places within the container.

2. Description of Prior Art

The important or principal electronic circuits are delivered nowadays in the form of the so-called "chip" in order to improve their operation reliability as well as the efficiency of assembly plants. Thus, the preliminary and/or final assembly lines are supplied with the IC chips which are arrayed in a considerably large transporting container, which has a plurality of chip-holding recesses forming longitudinal and transverse rows. Generally, a robot hand or the like equipped beside one side of a transporting route supplies a IC chips one by one from the large container to the assembly line. Therefore, the robot hand must reciprocate a long distance in order to pick up the IC chip positioned near the other side of the transporting route. Consequently, an average waiting time for the assembly line to receive the individual IC chips becomes long to thereby lower the production efficiency. Further, the robot hand must change its position every time when it picks up the IC chips. In the event that the robot hand fails to grip any IC chip at its correct portion, the IC chip would be broken and the assembly line would be disturbed seriously. In order to avoid such an incident, the position control of robot hand should be so accurate as undesirably raising the control system cost.

It has been already proposed in this industrial field to employ a band-shaped container which comprises a single row of recesses each holding one IC chip. This container advances in an intermittent manner, and a robot hand reciprocates a short distance between the transportation route and the assembly line. The container, which typically is an injection-molded plastics band, has walls of a thickness sufficient to protect the IC chips. As shown in FIG. 16, a bottom defining each recess "f" in the row has a round hole "e" for insertion of an ejector. Small apertures "g" formed along one side of the band are for engagement with a sprocket wheel. This band, wound on a reel in use, has however proved somewhat problematic in a certain point. The phantom lines "C" in FIG. 16 indicate an inevitable curvature remaining in the band unwound from "the reel. In other words, the unwound band cannot take again its absolutely straight position indicated by the solid lines "D". The curled band will cause a misoperation of the robot hand which must exactly pick up the IC chips one by one. If the recess walls were rendered as thin as possible to eliminate such a drawback, then another problem would arise that the band becomes so fragile and is broken when handled, thus failing to afford a sufficient protection to the band. A damaged transporting band will also hinder the IC chips from being picked up in an accurate manner. Another disadvantage inherent in the prior art containers ( here called "trays" ) is that they occupy much space for storage and handling, and require much labor for replacement of some unit trays with new ones. In addition, it is not necessarily easy to supply the unit trays in any desirable linked form. Further, the trays for the IC chips of some kinds have to withstand a necessary baking treatment, thereby raising the manufacture cost of the trays.

SUMMARY OF THE INVENTION

An object of the present invention, which was made to eliminate the drawbacks in the prior art container for transporting precision devices arranged therein in longitudinal and transverse rows or in a single longitudinal row, is therefore to provide a linked container composed of a plurality of repeating units of substantially the same shape like a chain widely used in machinery, wherein the repeating units have recesses to respectively receive the IC chips or the like and are connected one to another to form an endless band. Another object of the invention is to provide a linked container composed of the repeating units each having a recess for stably holding therein each IC chip, wherein each unit comprises connected arms outwardly extending from its opposite sides to link the units capable of flexing relative to one another, so that they can more easily be wound on a reel without causing any curvature to remain in the band unwound therefrom. Still another object is to provide a linked container which is free from the disadvantages in the prior art trays, and can withstand the baking treatment together with the IC chips held therein, thus enabling the baked trays to be recycled.

A linked container, which is provided herein for transporting precision devices and constructed in such a manner as to achieve the objects, does characteristically comprise a flexible band having: a series of recesses (11) arranged along the band for receiving transported articles; and a row of small apertures (14) along at least one of opposite sides (12, 13) of the band, with the apertures (14) being arranged at regular intervals along the full length of the band, and engageable with and disengageable from driving lugs of a stepping driver; the flexible band being a row of repeating plastics units (10) which are of the same dimension at least in the longitudinal direction of the band; each unit (10) defining at least one recess (11) and having opposite transverse sides "A" and "B", the band further comprising junctions each formed between the side "A" of one unit (10) and the side "B" of the next unit; and, the junction being a hinge (22, 24; 51, 52; 22e, 24e, 57) which allows the juxtaposed adjacent sides "A" and "B" to rotate relative to and in parallel with each other, wherein a distance from the junction to the aperture (14) closest thereto on one unit (10) is the same as another distance from this junction to the other aperture (14) similarly closest thereto on the next unit.

It is desirable that if each recess and outer walls surrounding it are shaped square or rectangular, one the sides "A" of one unit is kept along its full length close to the full length of the other side "B" of the next unit, whether they are bent or stretched. It is noted however that depth, configuration and/or dimension in plan view of the recess formed generally centrally of each unit does depend on the shape and dimension of the articles such as IC chips which are to be received in the recess. In one example, the recess is about 15 mm square and 3 mm deep, and its surrounding walls excluding any arm which may extend therefrom have a dimension of 24 mm×20 mm.

The recess need not be square or rectangular in plan view, but may be elliptic or polygonal. In any case, it is an important feature in the present invention that the hinge is interposed between two adjacent repeating units each formed with the recess so that they can be bent and stretched freely and readily. Typically, such a hinge comprises, for each side of the unit, a pair of two arms extending in opposite directions along two parallel lines perpendicular to the sides facing one another. A small protrusion is formed near and integral with an end of each arm from the one side, so as to protrude transversely in parallel therewith. Correspondingly, a transverse opening is provided near and integral with an end of each arm from the other side, so that each protrusion mates with the corresponding opening. Two small protrusions may be disposed in the same direction, or alternatively in opposite directions.

In another example of the hinge, an annular groove is formed around each transverse protrusion which is a short rod in parallel with one side of the unit, and each arm extending from the other side has a lower portion formed with a cutout. An inner region of this cutout is fitted on the grooved protrusion to be rotatable relative thereto, while an outer region continued from the inner region however being slightly narrower than it. In still another example, a spherical protrusion is formed at the end of each arm from one side of the unit, and an upwardly opened cavity is formed in a cubic end of each of other arms from the other side. This cavity is defined by a vertical outer region or slit of a width slightly larger than the diameter of the former arms. The slit is continued to an inner region of a width slightly smaller than the diameter of the spherical protrusion, and has an enlarged, generally spherical space formed at a middle height of the inner region. The enlarged space is of such a dimension as permitting the protrusion to fit therein, thereby constructing a kind of ball joint.

In a further example of the hinge, two arms extend from one of the adjacent sides facing one another, along two lines perpendicular to the sides. At least one arm extends from the other side, likewise along the lines, wherein transverse openings penetrate end portions of those arms and are in alignment with one another to receive therethrough a pin. In a still further example, tabs outwardly protrude from and integral with the opposite sides of each unit so as to extend in parallel with a plane including the facing sides. A straight crease or fold intervenes each side and the tab extends therefrom, and these tabs belonging to the adjacent units are overlaid and fixedly adjoined one to another. It is noted here that each unit may have two or more recesses which are arranged to provide one or more rows between and along the sides "A" and "B".

The apertures, for example round apertures, engaging with the driver of the transporting mechanism may be arranged to form a single row along one of lateral sides of the band, or to form two rows along the respective sides. In an example of the arrangement, the round apertures are disposed at regular intervals, that is at a given pitch, in an intermediate region between the transverse sides. A cutout corresponding to a half of the aperture is formed at each corner where the transverse side intersects the lateral side. Thus, two cutouts can constitute a single recessed region of a width equal to the diameter of said aperture when the adjacent transverse sides are juxtaposed, whereby the pitch of the apertures is not disturbed between the neighboring units. Alternatively, any cutout may not be formed through the abutting sides, but the distance from each transverse side to the nearest aperture may be half a distance between two apertures, thereby also avoiding any irregularity in the aperture pitch. All the apertures engaging with the sprocket or other stepping drive may not be circular holes but may be cutouts extending inwardly from the lateral sides, or any small lugs protruding upwardly, downwardly or outwardly from said lateral sides.

A hole may be formed through the central bottom portion of each recess so that the IC chip can be ejected by an ejector pin upon arrival at a destination. Those central holes may preferably be bigger than the side apertures to allow a thick ejector pin to gently push the IC chip.

In a case wherein the IC chip has an ear-shaped protrusion extending sideways, the recess bottom may be formed with a pair of finger-shaped lugs which hold therebetween such a protrusion. An additional hole, which will function similarly to the central hole, may penetrate the region of a recessed bottom between said lugs.

The linked container constructed as above comprises a number of the repeating units which can be mass-produced by the injection molding of a suitable plastic. Every unit can be connected to the next one, by forcibly clicking the small protrusions at the arm ends at the transverse side "A" into the apertures at the other arm ends at the other side "B". This operation to form the hinge a junction between two units will be repeated many times to provide a container train of a given length.

The linked container provided herein will operate in the same manner as the prior art containers, but much more smoothly when wound on and unwound from a reel, by virtue of the chain-like hinge which facilitates the bending and stretching between the adjacent units. Such a hinge is effective also to prevent any curvature from remaining the stretched container. The container, whose chain length may previously be adjusted, can be heat treated in a baking oven for the processing of IC chips in the container.

BRIEF DESCRIPTION OF THE DRAWINGS

Embodiments of the present invention are illustrated in the drawings, in which.

THE PREFERRED EMBODIMENTS

Figure 1:
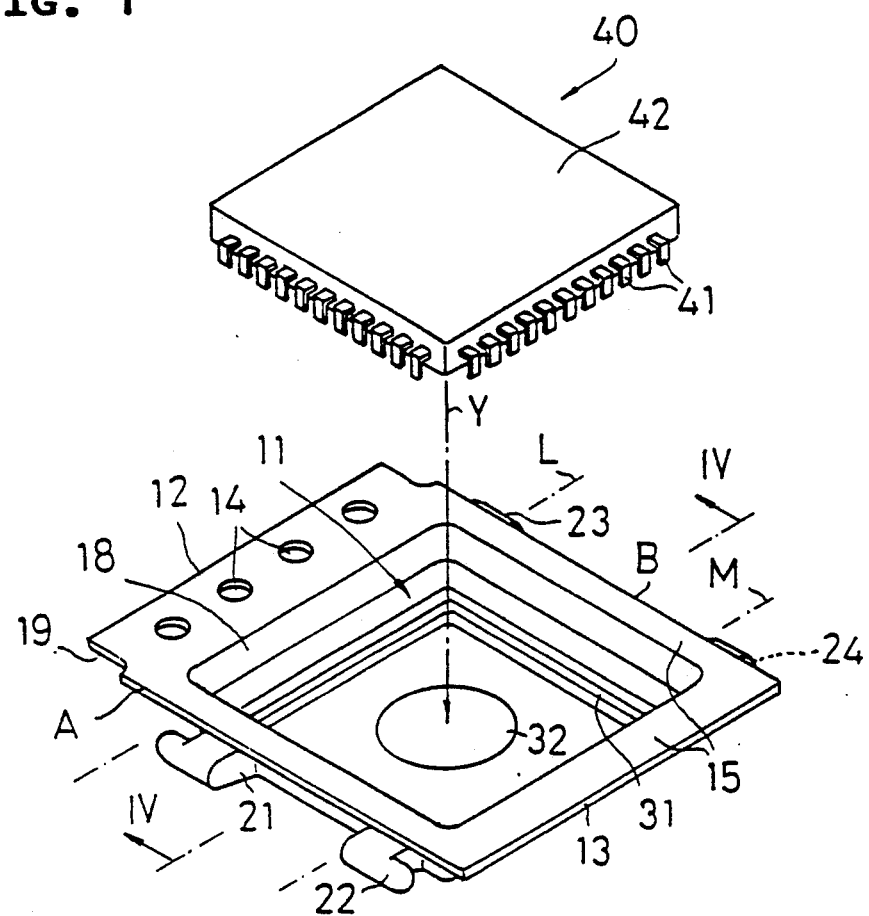
FIG. 1 is a perspective view showing a repeating unit construction of a linked container in a first embodiment, together with an article to be received therein.

Some embodiments will now be described referring to the drawings. A linked container for transporting precision devices, which is shown in FIGS. 1 to 5, is provided in accordance with a first embodiment. This container is produced by injection molding a polystyrol resin, and assumes a band as shown in FIG. 2, wherein it comprises a row of recesses 11 each for receiving an IC chip (i.e., a small-sized integrated circuit formed on a wafer) as an example of the articles to be transported. The stepping driver's lugs (not shown) in a transportation system are adapted to engage with a plurality of apertures 14 arranged along one lateral side 12 of the band at regular intervals over its full length.

Figure 2:
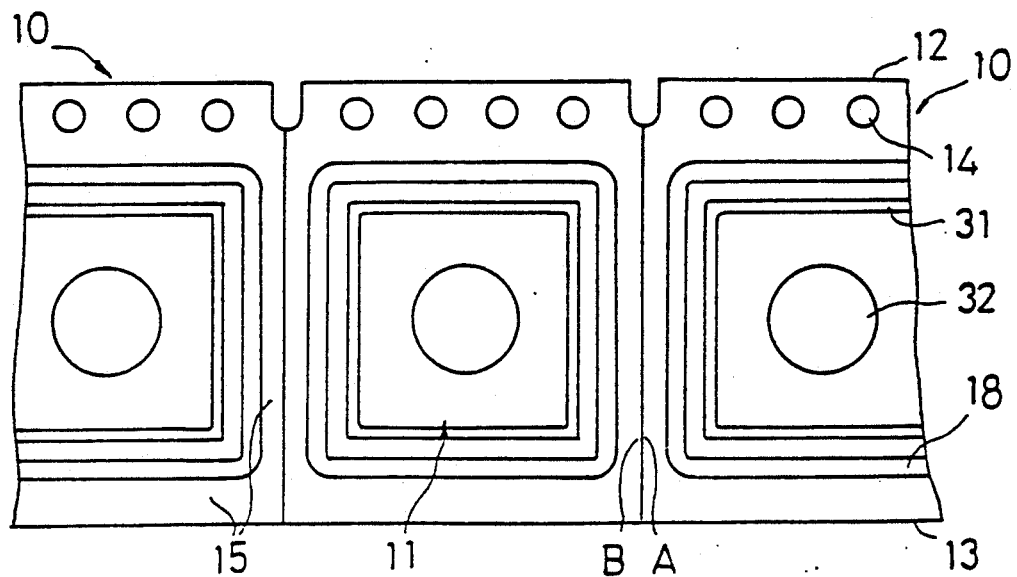
FIG. 2 is a plan view showing the linked container which comprises the units connected one to another.

FIG. 1 shows that the linked container provided herein does characteristically comprise repeating units 10 each having the recess 11 formed centrally thereof. The recess 11 is a concave portion which is surrounded by a peripheral flange 15 having a width of 2-4 mm, and recessed downwardly in the drawings. Each unit 10 has transverse sides "A" and "B" opposite one another, and walls 16 and 17 under the flange 15. Two pairs of arms 21 and 21, and 23 and 23, are integral with the walls 16 and 17, respectively, and extend outwardly along the imaginary lines "L" and "M" perpendicular to the transverse sides. Those arms construct junctions of the hinge type between two adjacent units 10 and 10, as will be detailed later.

A short columnar protrusion 22 is formed integral with the end portion of each arm 21 from one side "A", and those protrusions have their extremity rounded and extend outwardly in opposite directions. Correspondingly, a transverse opening 24 is formed through the end portion of each of the other arms 23 from the other side "B". The respective protrusions 22 can snap in an elastic manner into the openings 24. The diameter of such protrusions and openings in this embodiment is about 1.2 mm. The protrusions 22 thus clicked into the openings 24 build the hinge for connecting the adjacent units, so that the arms 21 are bendable and stretchable relative to the mating arms 23.

Figure 3:
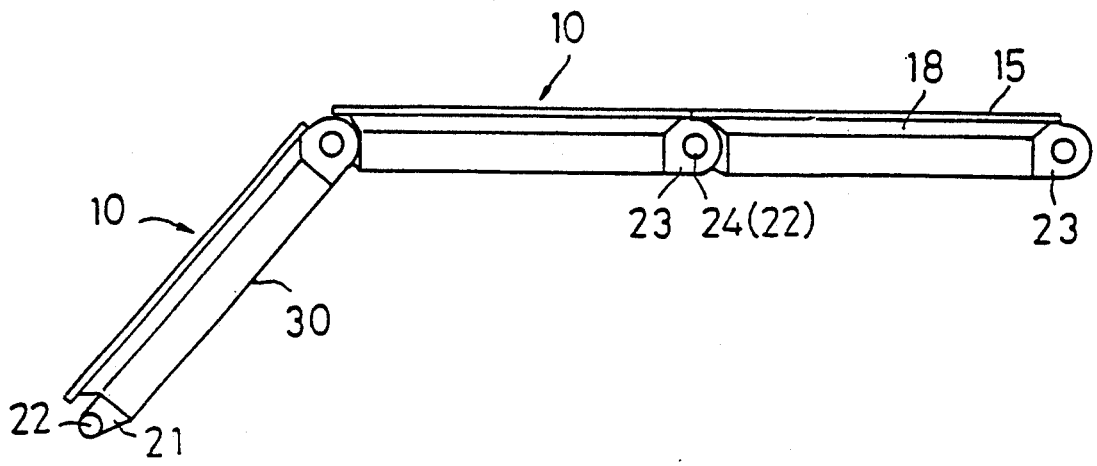
FIG. 3 is front elevation showing in part the container and illustrating its portion where the units are bent.
Figure 5:
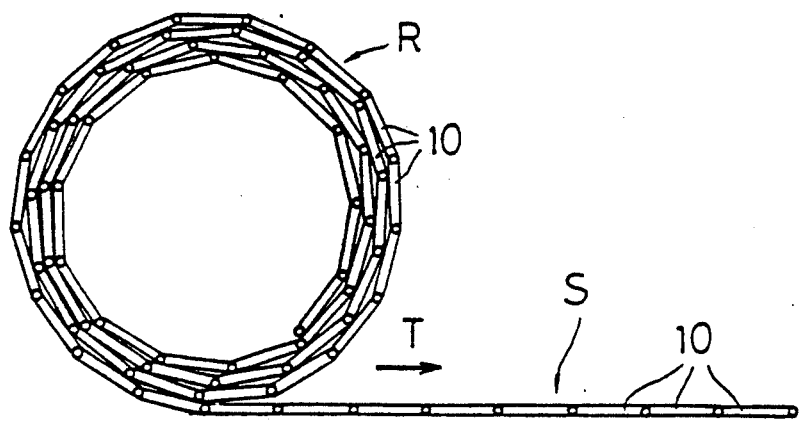
FIG. 5 is a front elevation showing, on a reduced scale of the container in use.

A distance between the axes of the protrusion 22 and opening 24 disposed near one lateral side 12 is equal to the distance between the other axes of those protrusion and opening near the other lateral side 13. This feature ensures the free bending of the band at its portion between the adjacent units 10 and 10 as shown in FIGS. 3 and 5. A cutout 19 in FIG. 1 is formed at the unit's corner where the transverse side "A" or "B" intersect the lateral side 12 or 13. Two adjacent cutouts 19 are shaped complementary with one another to provide a slot which functions as if it were one of the side apertures 14. In other words, such a configuration of cutouts at the junction between the adjacent units is also effective to drive the container to advance forwards.

Figure 4:
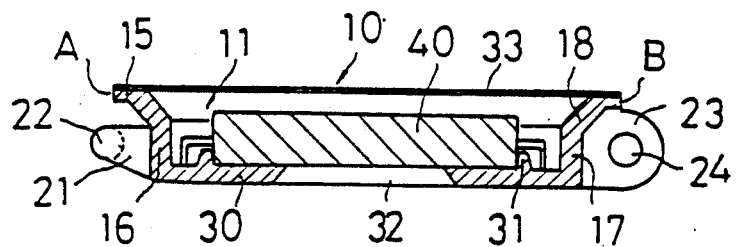
FIG. 4 is a cross section taken along the line IV—IV in FIG. 1.

The linked container described above will be used in the following manner as shown in FIGS. 1, 4 and 5. The articles carried by the container in this embodiment are, for example, a number of square IC chips 40. Each IC chip has a plurality of input-output pins 41 protruding from each side. Those chips will be inserted into the recesses 11 as indicated by the phantom line "Y" in FIG. 1, wherein the bent ends of the pins 41 will bear against the inner surfaces of the walls 16 and 17. The body 42 of each chip will closely fit in a low compartment defined by low ridges 31 formed upright from the bottom 30 of the recess and along the four sides thereof. After insertion, a protective film 33 will cover each recess and be adhered to the peripheral flange 15. This film protects the received article from any dust and also from unintentional slippage out of the recess 11 while this container is transported or handled. The linked container carrying the chips will be bent at junctions between the units as shown at "R" in FIG. 3 when wound on a reel (not shown) in a manner shown in FIG. 5. Such a reel will be delivered to any desired station on the assembly line or any processing line. The linked container will be pulled off the reel as indicated by "T" at said station so that the units successively advances onto a common flat plane as indicated by "S" At a given location on the place, an ejector pin will be thrust through the round hole 32 of the bottom 30 so as to unload the chip out of the recess 11. A robot arm disposed near the given location will thus pick up the chip and move it onto any desired location on the assembly line. In other words, the precision devices such as IC chips in the recesses each sealed with a cover tape (i.e., protective film) are supplied to a "surface mounting machine", and this machine ejects with its pin the devices and subsequently positions them one by one to the designed portions on a circuit board.

Figure 6:
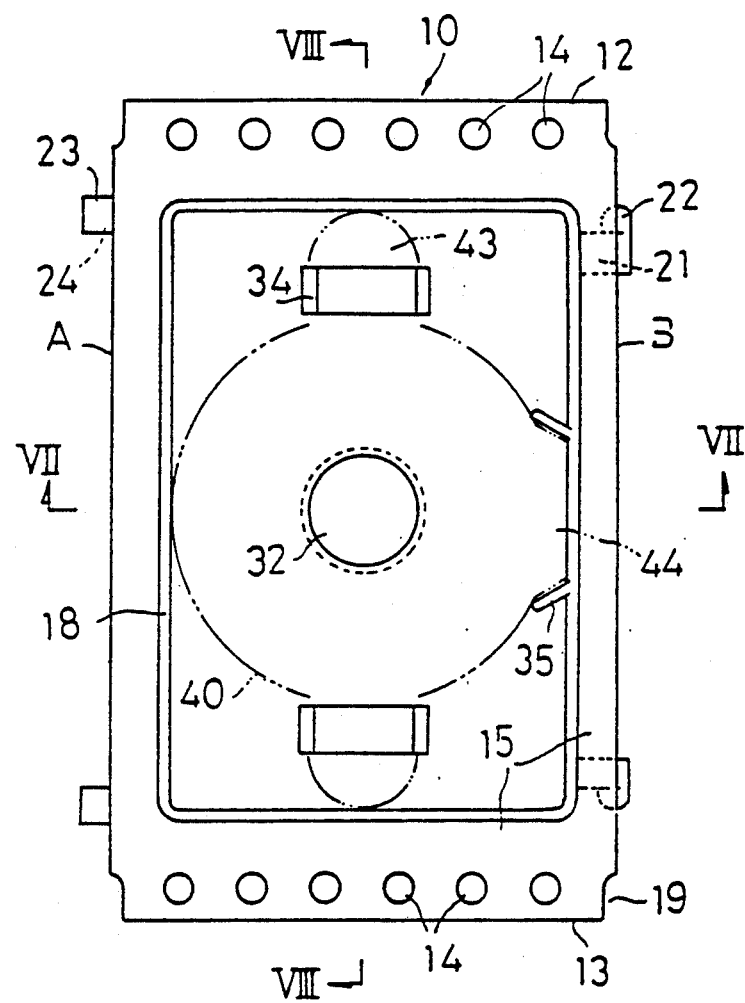
FIG. 6 is a plan view showing a repeating unit forming a linked container in a second embodiment.
Figure 7:
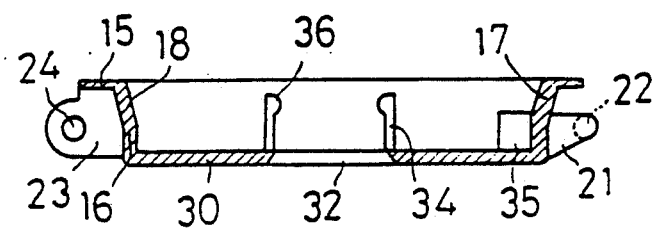
FIG. 7 is a cross section taken along the line VII—VII in FIG. 6.
Figure 8:
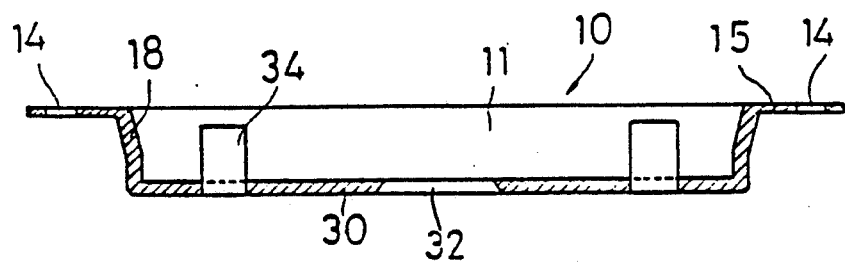
FIG. 8 is another cross section taken along the line VIII—VIII in FIG. 6.
Figure 16:
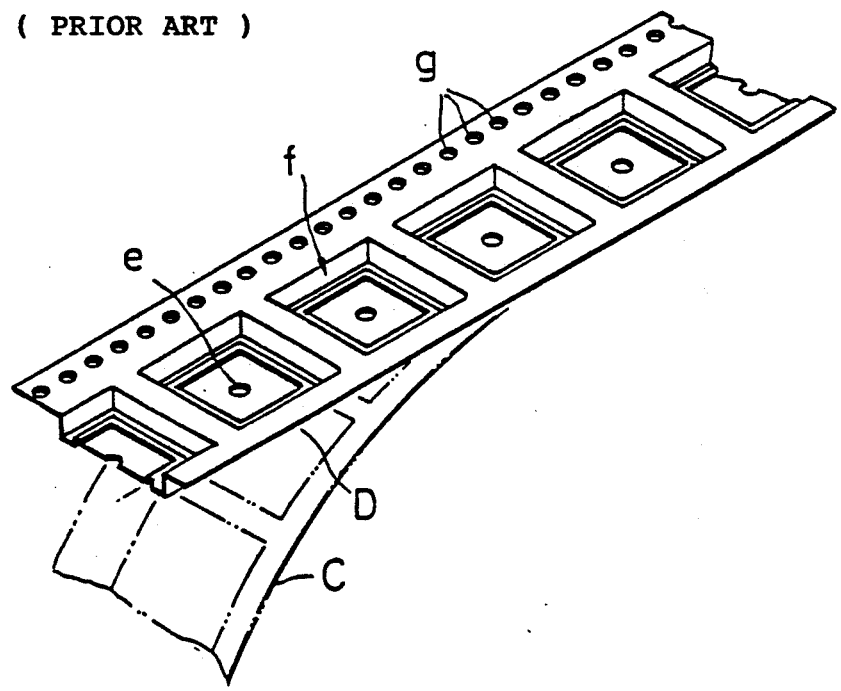
FIG. 16 is a perspective view showing a prior art container.

The container in a second embodiment shown in FIGS. 6 to 8 comprises rectangular recesses 11 and two rows of apertures 14 arranged along both the lateral sides 12 and 13, with the apertures being engageable with sprockets or the like. This container is also different from that in the first embodiment in the following points. Since the chip as an example of the article accommodated in each recess has a round body 42 and ears 43 and 44, the low ridges 31 (gripping the chip body in the first embodiment) are replaced with pairs of parallel fingers 34 or oblique fingers 35 which grip the ears. Bumps 36 are formed at upper ends of at least one pair of fingers 34 so as to face one another, so that the ear will be retained between the fingers and the bottom 30, thus preventing the chip from slipping off the recess 11. In this manner, the devices such as IC chips are secured by the ears to the bottoms to recesses 11 (i.e., "pockets") of the repeating units 10.

The flanges 15 in both the first and second embodiments is about 0.4 mm thick, but the bottom 30 and the walls 16 and 17 are about 0.7 mm thick. Such thicker bottom and walls, which will not be deformed during the operation of those containers, give a surer protection to the accommodated articles. Further, those containers can be used again if required, though they have generally been thrown away after used one time. It will be understood that the number of the repeating units in the container of the invention may be changed easily when it is recycled.

Figure 8A:
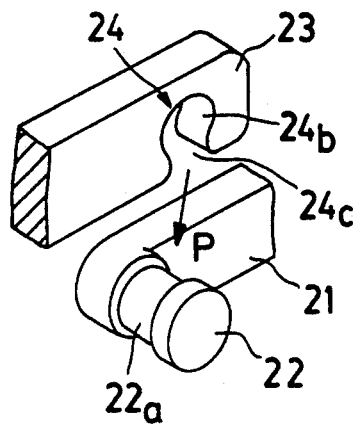
FIG. 8A is a perspective view showing in part a third embodiment.
Figure 8C:
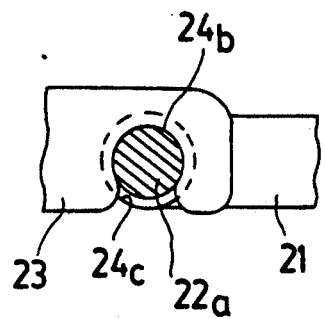
FIG. 8C is a cross section of the part in the third embodiment.
Figure 8B:
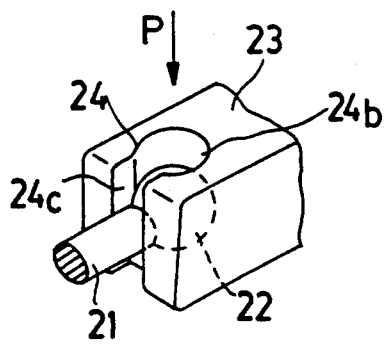
FIG. 8B is a perspective view showing in part a fourth embodiment.
Figure 8D:
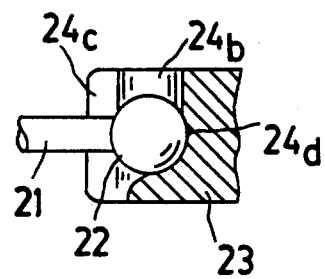
FIG. 8D is a cross section of the part in the fourth embodiment.

Upper portions 18 of the four walls 16 and 17 defining each recess 11 in the foregoing embodiments are tapered outwardly towards the flange 15. Those tapered portions render the recesses convenient for putting the articles in and out, and particularly facilitate the loading of the precision devices in the taping process. In a third embodiment shown in FIG. 8A, an annular groove 22a is formed around each transverse protrusion 22 of each arm 21 extending from one transverse side. Each arm 23 from the other side has a lower portion formed with a downwardly opened cutout 24. An inner region 24b of this cutout is fitted in the groove 22a to be rotatable relative thereto, with an outer region 24c continued from the inner region however being slightly narrower than it. Therefore, the latter arm 23 can be forced, as indicated by the arrow "P" in FIG. 8A, to click into engagement with the former arm so that the repeating units 10 made of an elastic plastics can be readily connected one to another. In a fourth embodiment which is shown in part in FIG. 8B and FIG. 8D, a spherical protrusion 22 is formed at the end of each arm 21 from one side of the unit, and a cavity is formed in cubic arms 23 from the other side. This cavity is defined by a vertical outer slit 24c of a width slightly larger than the diameter of the former arm 23. The slit 24c of each arm 23 is continued to an inner region 24b of a width slightly smaller than the diameter of the spherical protrusion 22. This inner region has an enlarged, generally spherical space 24d formed at its middle height and having such a dimension as allowing the protrusion to fit therein. The former arm 21 is to be pressed against the latter arm in a direction indicated by the arrow "P", thereby causing the protrusion 22 to snap into the enlarged space 24d so that the repeating units made of the elastic plastics can be readily connected one to another.

Figure 9:
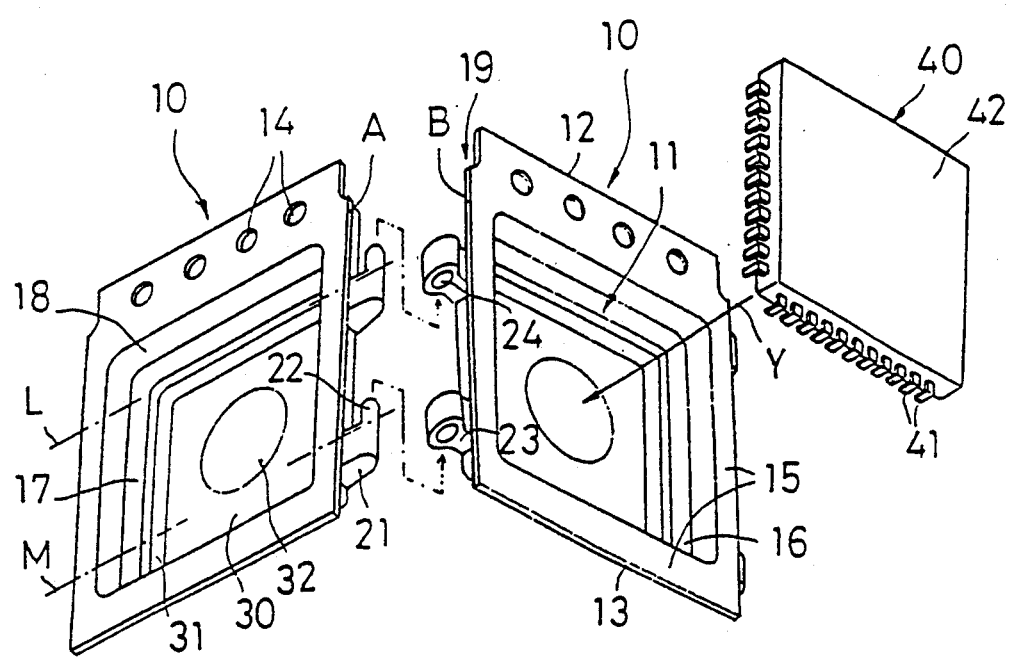
FIG. 9 is a perspective view showing in part a repeating unit forming a linked container in a fifth embodiment, together with the article to be received therein.

In a fifth embodiment shown in FIG. 9, small protrusions 22 extend in the same direction from the end portions of arms 21 which extend from one side "A". The other arms 23 from the other side "B" have their end portions formed with openings 24, and the protrusions 22 are caused to elastically fit therein slidably and rotatively relative thereto. Those protrusions 22 and openings 24 in this embodiment constitute a hinge, and the following unit is caused to slide along the leading unit in order to provide a junction between them at their arms, thus rendering easier the assembly of the band-shaped linked container. It is noted that extremities of the protrusions 22 have a diameter slightly greater than that of the openings 24, though not shown in FIG. 9. Due to this feature, the protrusions will not be removed from the openings if handled in a usual manner.

Figure 10:
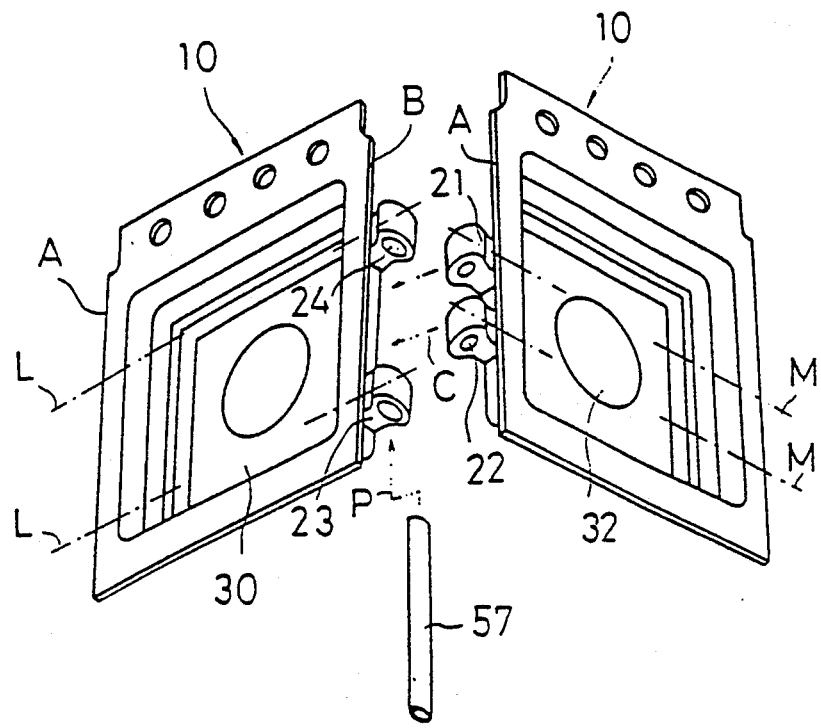
FIG. 10 is a perspective view also showing in part a repeating unit forming a linked container in a sixth embodiment.
Figure 11:
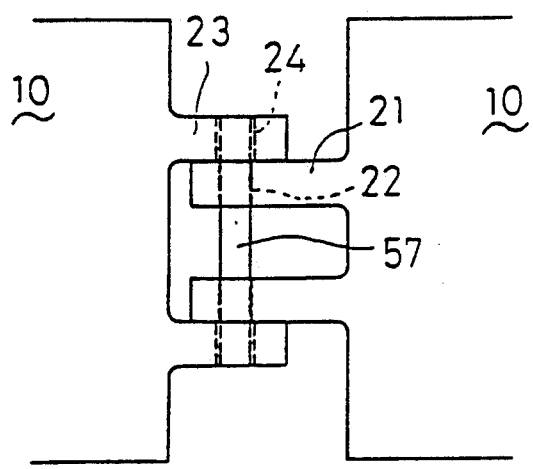
FIG. 11 is a plan view schematically showing the part in the sixth embodiment.

In a sixth embodiment shown in FIG. 10, two arms 21 extend from one transverse side, and also two arms 23 extend from the other side. Transverse openings 22e and 24e are formed to penetrate end portions of those arms and are in alignment with one another to receive therethrough a pin 57, which similarly constitutes together with the openings a hinge-like junction. As will be seen in FIG. 11, the pin 57 fits very tightly in the openings through the inner arms 21, but loosely in those through the outer arms 23 so as to be rotatable therein. Base portions of the two inner arms may be integral with each other, or alternatively a single arm may take place of the two inner arms. Since the pin is adopted in this embodiment and the joint resembles the well known hinges, not only the operation for manufacturing the band-shaped container is easy, but also it can be bent and stretched very smoothly between its adjacent units.

Figure 12:
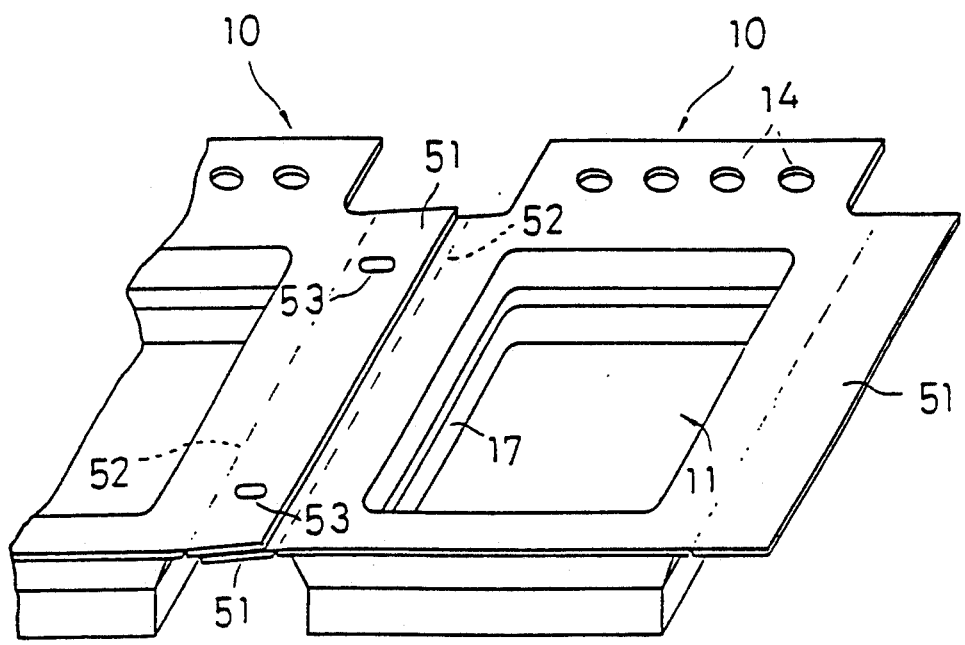
FIG. 12 is a perspective view also showing in part a repeating unit forming a linked container in a seventh embodiment.
Figure 13:
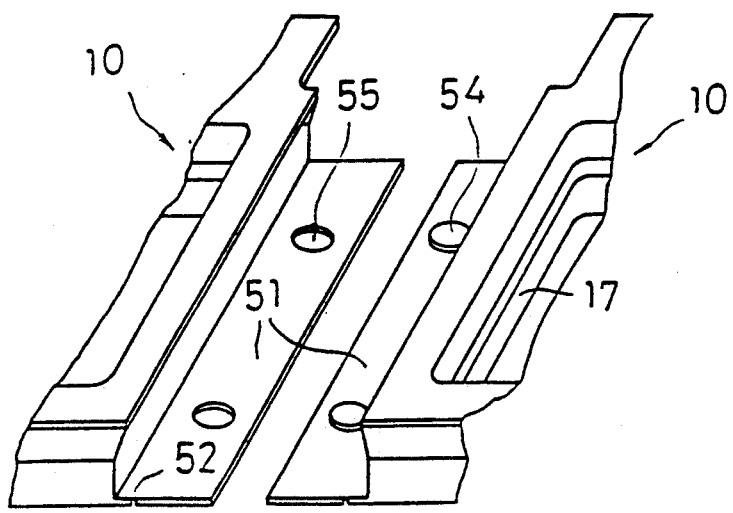
FIG. 13 is another perspective view showing in part a modification of the seventh embodiment.
Figure 14:
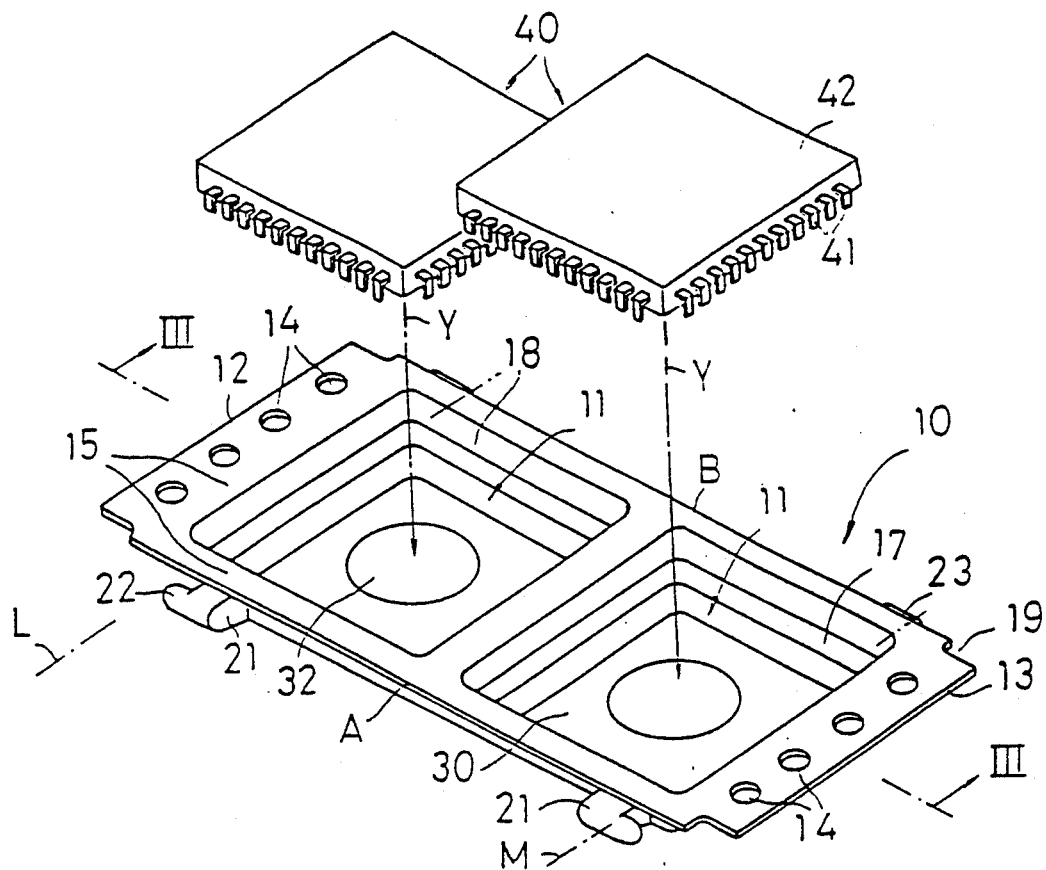
FIG. 14 is a perspective view showing in part a repeating unit forming a linked container in a eighth embodiment, together with the article to be received therein.
Figure 15:
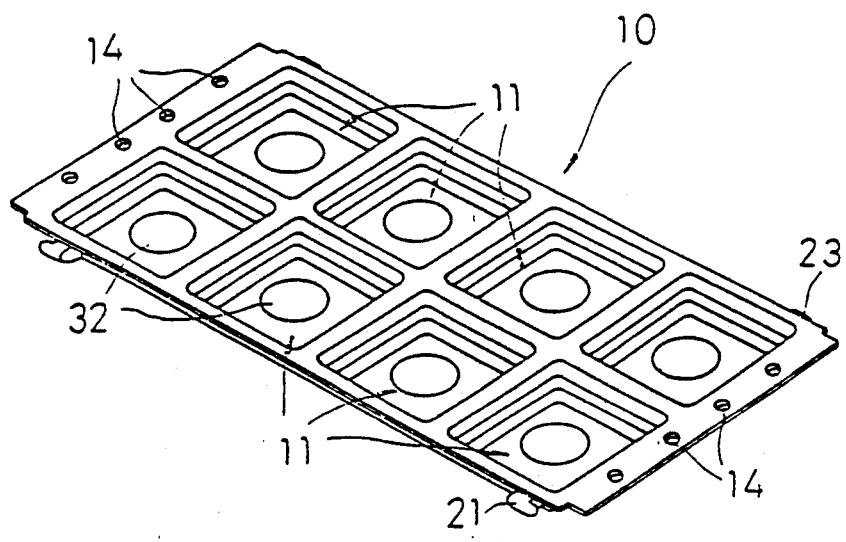
FIG. 15 is another perspective view showing in part a modification of the eighth embodiment.

FIG. 12 shows a seventh embodiment, tabs 51 outwardly protrude from and integral with the opposite sides "A" and "B" of each unit so as to extend in parallel with a plane including the facing sides. A straight crease or fold 52 intervenes each side and the tab extending therefrom, and these tabs 51 and 51 respectively belonging to the adjacent units 10 and 10 are overlaid one on another and fixedly adjoined one to another. Those tabs 51 and crease 52 construct the hinge type junction. The means for adjoining those tabs may be spot welding, or the buttonhook shown in a modification shown in FIG. 13. In this modification, round button-like lugs 54 are formed on one tab so that they are forced into small holes 55 through the other tab. Since the bottoms of the adjacent units are connected to each other by the tabs in FIG. 13, this band can be wound to have a smaller diameter if the bottoms are laid inside the flange. It is not necessary in the examples shown in FIGS. 12 and 13 to form any arm having a transverse opening. Thus, the injection molding of the repeating units is easier in this case, and besides their connection is not difficult. FIG. 14 shows an eighth embodiment, in which each unit 10 has two recesses 11 and 11 in a row between the transverse sides "A" and "B" In a modification shown in FIG. 15, each unit 10 has eight recesses 11 which are arranged to form two rows each comprising four recesses. In order to prevent such a broader band from advancing obliquely, the driven apertures 14 are formed at regular intervals along each lateral sides of the container. This embodiment is advantageous when the IC chips are considerably small compared with the repeating unit of the container, because a plurality of them can be accommodated in one unit to thereby improve the efficiency in feeding them to an assembly line of precision instruments.

It will be noted that the scope of the present invention is not delimited to the embodiments but may be modified in any manner insofar as the essential features herein will achieve the objects and affords the advantages summarized below. As an example of such modifications, the protrusions of the arms from one transverse side may extend to face one another. The repeating units, especially their chip receiving recesses, may be of any different shapes so long as they have the same length in the longitudinal direction of the container.

In summary, the present invention offers a linked band-like container which is composed of a series of repeating units of a sufficient thickness. There is no fear that any unit is deformed when the container is smoothly wound on or unwound from a reel or the like, and no curvature will remain in the stretched container. Therefore, the container provided herein is most suited as a container for the IC chips or the like which must be handled carefully and positioned accurately after delivered to users and when treated by them. In other words, each unit having a rigid pocket are connected one to another to form a band which can be stretched without causing any curvature to remain when the thus carried devices are fed to a surface mounting machine operating at high precision.

What is claimed is:

1. A linked container for transporting precision devices, the container comprising:

a row of repeating adjacent units (10) made of plastics and shaped to receive transported articles;

each unit having along at least one of opposite lateral sides (12, 13) a row of apertures (14) arranged at regular intervals, with the apertures being engageable with and disengageable from driving lugs of a stepping driver;

each unit (10) defining at least one recess (11) and having first and second opposite transverse sides (A and B), the container further comprising:

junctions formed between the first side (A) of one unit (10) and the second side (B) of an adjacent unit (10);

each junction being a hinge which allows juxtaposed adjacent first and second sides (A and B) to rotate relative to and in parallel with each other, each hinge between adjacent units (10) is composed of a first pair of arms (21, 21) pair of arms extending to extending perpendicularly outwardly from the first opposite transverse side of one unit and a second pair of arms (23, 23) extending perpendicularly outwardly from the second opposite transverse side of an adjacent unit;

a short columnar and transverse protrusion (22) formed integral with an end portion of each arm (21) of said first pair of arms with said transverse protrusions extending in opposite directions; and a transverse opening (24) formed through an end portion of each of said second pair of arms (23) so that the respective transverse protrusions (22) snap into the respective transverse openings (24).

2. A linked container as defined in claim 1, wherein each unit (10) has at least two recesses (11) which are arranged to form at least one row between the transverse sides (A and B).

* * * * *